(12) United States Patent
Tanaka et al.

(10) Patent No.: US 10,622,237 B2
(45) Date of Patent: Apr. 14, 2020

(54) CONVEYING MECHANISM

(71) Applicant: DISCO CORPORATION, Tokyo (JP)

(72) Inventors: Kazunari Tanaka, Tokyo (JP); Satoshi Ohkawara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/387,728

(22) Filed: Apr. 18, 2019

(65) Prior Publication Data
US 2019/0326135 A1 Oct. 24, 2019

(30) Foreign Application Priority Data
Apr. 19, 2018 (JP) .................. 2018-080387

(51) Int. Cl.
*H01L 21/677* (2006.01)
*B65G 47/91* (2006.01)
*B65G 17/12* (2006.01)

(52) U.S. Cl.
CPC .......... *H01L 21/6773* (2013.01); *B65G 17/12* (2013.01); *B65G 47/91* (2013.01)

(58) Field of Classification Search
CPC ...... H01L 21/6773; B65G 17/12; B65G 47/91
USPC .................................... 198/470.1
See application file for complete search history.

(56) References Cited

U.S. PATENT DOCUMENTS

2013/0267065 A1* 10/2013 Nakata ............... H01L 21/50 438/118

FOREIGN PATENT DOCUMENTS

| JP | 09027543 A | 1/1997 |
|---|---|---|
| JP | 2017069370 A | 4/2017 |

* cited by examiner

*Primary Examiner* — Gene O Crawford
*Assistant Examiner* — Lester Rushin, III
(74) *Attorney, Agent, or Firm* — Greer Burns & Crain, Ltd.

(57) ABSTRACT

A conveying mechanism for conveying a wafer unit having a wafer disposed inside of and supported on an annular frame by a holding tape includes a housing tray housing the wafer unit therein and a transport unit supporting and transporting the housing tray between wafer treating apparatus. The housing tray includes a ceiling plate and a bottom plate that are interconnected by a pair of side walls facing each other across an opening defined in a side through which the wafer unit can be taken into and out of the housing tray. An air flow generator is disposed on the ceiling plate for generating air downflows in the housing tray that are directed from the ceiling plate into the opening. The transport unit conveys wafer units, one by one, between the wafer treating apparatus.

9 Claims, 5 Drawing Sheets

CONVEYING MECHANISM

BACKGROUND OF THE INVENTION

Field of the Invention

The present invention relates to a conveying mechanism for conveying wafers to wafer treating apparatus.

Description of the Related Art

When semiconductor wafers are to be processed in a cutting step, a grinding step, or other steps, a plurality of, e.g., 25, such wafers are stored in a cassette, and conveyed together in the cassette between apparatus by the operator (see, for example, Japanese Patent Laid-Open No. Hei 9-027543). Heretofore, it has been customary for the operator to take out one wafer, at a time, from the cassette, put it through one of various processes, and repeat the cycle until all the wafers in the cassette are processed. Therefore, unless the processing of all the wafers in the cassette is completed in a preceding step, the cassette cannot be delivered to a subsequent step even if the subsequent step is ready for accepting the cassette, resulting in a wasteful standby time spent at the subsequent step. The inefficient situation cannot be avoided even if the cassette is conveyed by a robot rather than the operator.

The wasteful standby time can be eliminated if the operator delivers each wafer between apparatus. However, this approach greatly increases the amount of work to be performed by the operator, and tends to raise the cost because of possible additional operators required. For this reason, there has been developed a conveying mechanism for automatically conveying one wafer at a time between apparatus, as disclosed in Japanese Patent Laid-Open No. 2017-069370, for example. According to the disclosed conveying mechanism, each wafer is place in a housing tray, and housing trays are delivered by a conveyor interconnecting processing apparatus. Since wafers that have been processed in a preceding step are successively delivered to a subsequent step, any standby time spent at the subsequent step is minimized for more efficient wafer processing.

SUMMARY OF THE INVENTION

According to the conveying mechanism disclosed in Japanese Patent Laid-Open No. 2017-069370, however, the housing trays that carry the respective wafers are open upwardly for easy access to the wafers. Inasmuch as the housing trays are conveyed while the wafers placed therein are exposed, contaminants in the atmosphere are likely to be deposited on the wafers.

It is therefore an object of the present invention to provide a conveying mechanism that can reduce a wasteful standby time spent by a wafer treating apparatus connected to the conveying mechanism and that can prevent contaminants from being deposited on wafers conveyed by the conveying mechanism.

In accordance with an aspect of the present invention, there is provided a conveying mechanism for conveying a wafer unit having a wafer disposed inside of and supported on an annular frame by a holding tape. The conveying mechanism includes a housing tray housing the wafer unit therein and a transport unit supporting and transporting the housing tray between wafer treating apparatus. The housing tray includes a ceiling plate, a bottom plate, a pair of side walls facing each other across an opening through which the wafer unit can be taken into and out of the housing tray, for supporting the annular frame inserted into the housing tray through the opening and holding the inserted wafer unit in the housing tray, and an air flow generator disposed on the ceiling, for introducing a gas from an upper end of the housing tray to produce downflows in the housing tray that are directed from the ceiling plate into the opening, and the transport unit conveys wafers, one by one, between the wafer treating apparatus.

With the above arrangement, when the wafer unit is inserted into the housing tray through the opening, the wafer unit is held in the housing tray by the side walls. In the housing tray, downflows directed from the ceiling plate into the opening are generated by the air flow generator, preventing contaminants from being introduced into the housing tray through the opening. While the wafer unit is conveyed, no contaminants are deposited on the wafer. Consequently, clean wafers are transferred to the wafer treating apparatus. Furthermore, inasmuch as the transport unit conveys wafers, one by one, between the wafer treating apparatus, any standby time spent by subsequent wafer treating apparatus is minimized, resulting in a reduced wasteful standby time.

With the conveying mechanism according to the aspect of the present invention, since the wafer units are conveyed, one by one, a wasteful standby time spent by the wafer treating apparatus is reduced, and the downflows generated in the housing tray by the air flow generator prevent contaminants from being deposited on the wafer being conveyed.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
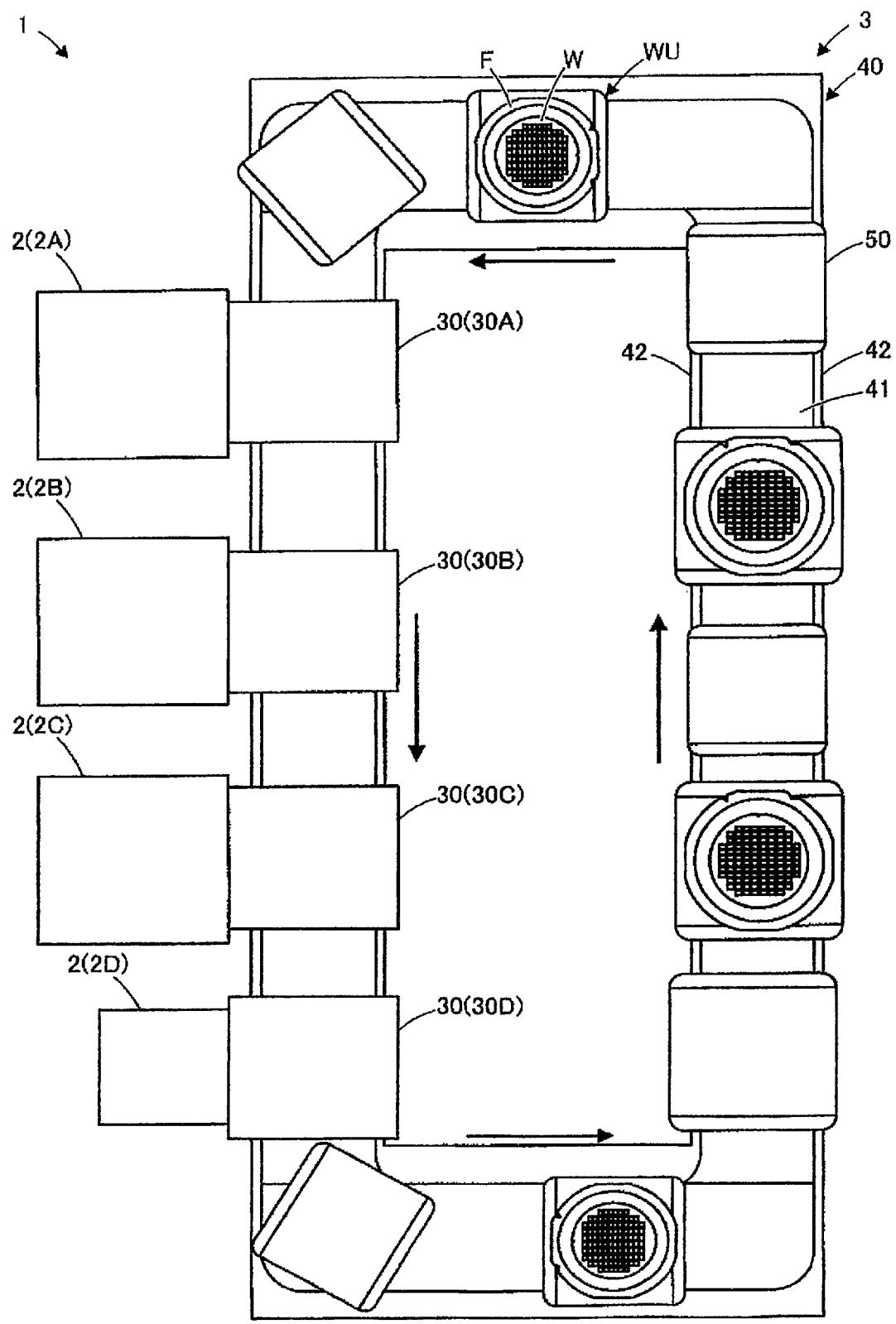
FIG. 1 is a schematic plan view of a wafer processing system according to an embodiment of the present invention.

A wafer processing system according to an embodiment of the present invention will be described in detail below with reference to the accompanying drawings. FIG. 1 is a schematic view of the wafer processing system according to the present embodiment. The wafer processing system to be described below is illustrated by way of example only and should not be construed as restrictive. The wafer processing system may be changed or modified as long as it incorporates a conveying mechanism according to the present embodiment for conveying wafers between wafer treating apparatus. In FIG. 1, ceiling plates in the wafer processing system is omitted from illustration for the sake of convenience.

As illustrated in FIG. 1, a wafer processing system, denoted by 1, includes a plurality of wafer treating apparatus 2 disposed along a conveying mechanism 3 that conveys wafers W handled as wafer units WU along a circulatory path. The wafer treating apparatus 2 include a loading apparatus 2A for loading wafers W into the conveying mechanism 3, processing apparatus 2B and 2C for processing wafers W, and an unloading apparatus 2D for unloading wafers W from the conveying mechanism 3. According to the present embodiment, the loading apparatus 2A includes a mounter, the processing apparatus 2B includes a cutting apparatus for cutting wafers of one type, the processing apparatus 2C includes a cutting apparatus for cutting wafers of another type, and the unloading apparatus 2D includes a cassette apparatus for housing wafers W.

The cassette apparatus includes an arm, not depicted, capable of loading a wafer unit WU into and unloading a wafer unit WU from a cassette, not depicted, on a rest base. The wafer treating apparatus 2 are not limited to the mounter, the cutting apparatus, and the cassette apparatus referred to above, but may be apparatus for processing wafers W in some ways. For example, the loading apparatus 2A may include a cassette apparatus, the processing apparatus 2B and 2C may include grinding apparatus, and the unloading apparatus 2D may include a die bonder. Since wafer units WU are conveyed along a circulatory path, the wafer treating apparatus 2 may be arranged in any order though it is preferable that the loading apparatus 2A, the processing apparatus 2B and 2C, and the unloading apparatus 2D be arrayed in the order named downstream along the circulatory path.

General wafer processing systems lacks the conveying mechanism 3 referred to above, but have a plurality of wafer units WU stored in a cassette and conveyed all together to wafer treating apparatus. The wafer treating apparatus that are of different types process the wafer units WU in different processing times, and the wafer treating apparatus of different types that are arranged as preceding and subsequent wafer treating apparatus may not simultaneously complete their processing operations on wafer units WU. Even if the processing of all wafer units WU in a cassette is completed in the subsequent wafer treating apparatus, no cassette is conveyed to the subsequent wafer treating apparatus unless the processing of all wafer units WU in a cassette is completed in the preceding wafer treating apparatus.

Therefore, in the general wafer processing systems, a wasteful standby time has to be spent by the subsequent wafer treating apparatus. In order to reduce such a standby time, the operator may carry wafer units WU whose processing has been completed in the preceding wafer treating apparatus, successively one at a time, to the subsequent wafer treating apparatus. However, the process is quite burdensome and tedious because the operator needs to move back and forth between the wafer treating apparatus.

According to the present embodiment, the conveying mechanism 3 does not convey a plurality of wafer units WU all together, but stores processed wafer units WU in respective housing trays 50 and conveys the wafer units WU in the housing trays 50 with a transport unit or transport means 40, one at a time, to a subsequent wafer treating apparatus, thereby reducing the standby time of the subsequent wafer treating apparatus.

The conveying mechanism 3 includes the transport unit 40 that has a conveyor 41 arranged in an annular pattern. The conveying mechanism 3 houses wafer units WU, one by one, in a plurality of housing trays 50 placed on the conveyor 41, and conveys the wafer units WU in the housing trays between the wafer treating apparatus 2 along a circulatory path. The upstream loading apparatus 2A loads wafer units WU, one by one, into respective housing trays 50 on the conveyor 41. The intermediate processing apparatus 2B and 2C take out wafer units WU from housing trays 50 and process each of wafers W included in the wafer units WU. The downstream unloading apparatus 2D takes out processed wafer units WU, one by one, from respective housing trays 50 and unloads the wafer units WU.

A plurality of transfer mechanisms 30A through 30D are arrayed along a conveying path of the conveyor 41 for transferring wafer units WU between the wafer treating apparatus 2 and the housing trays 50. The transfer mechanism 30A transfers a wafer unit WU from the loading apparatus 2A to a housing tray 50. The transfer mechanisms 30B and 30C introduce wafer units WU from housing trays 50 into processing apparatus 2B and 2C and return processed wafer units WU from the processing apparatus 2B and 2C into housing trays 50. The transfer mechanism 30D introduces a wafer unit WU from a housing tray 50 into the unloading apparatus 2D and returns the empty housing tray 50 to the conveyor 41.

Since the conveying mechanism 3 conveys wafers W carried in housing trays 50 between the wafer treating apparatus 2, contaminants may be possibly be deposited on the wafers W while they are being conveyed by the conveying mechanism 3. According to the present embodiment, each of the housing trays 50 has an upper area closed by a ceiling plate 55 (see FIG. 2) and two sides with respective openings 57 (see FIG. 2) defined therein. A wafer unit WU can be taken into and out of the housing tray 50 through one of the openings 57. Furthermore, in view of the possibility that contaminants may enter through the openings 57 and be deposited on the wafer W in each of the housing trays 50, air downflows directed from the ceiling plate 55 into the openings 57 are produced in the housing tray 50 to prevent contaminants from entering through the openings 57.

Figure 2:
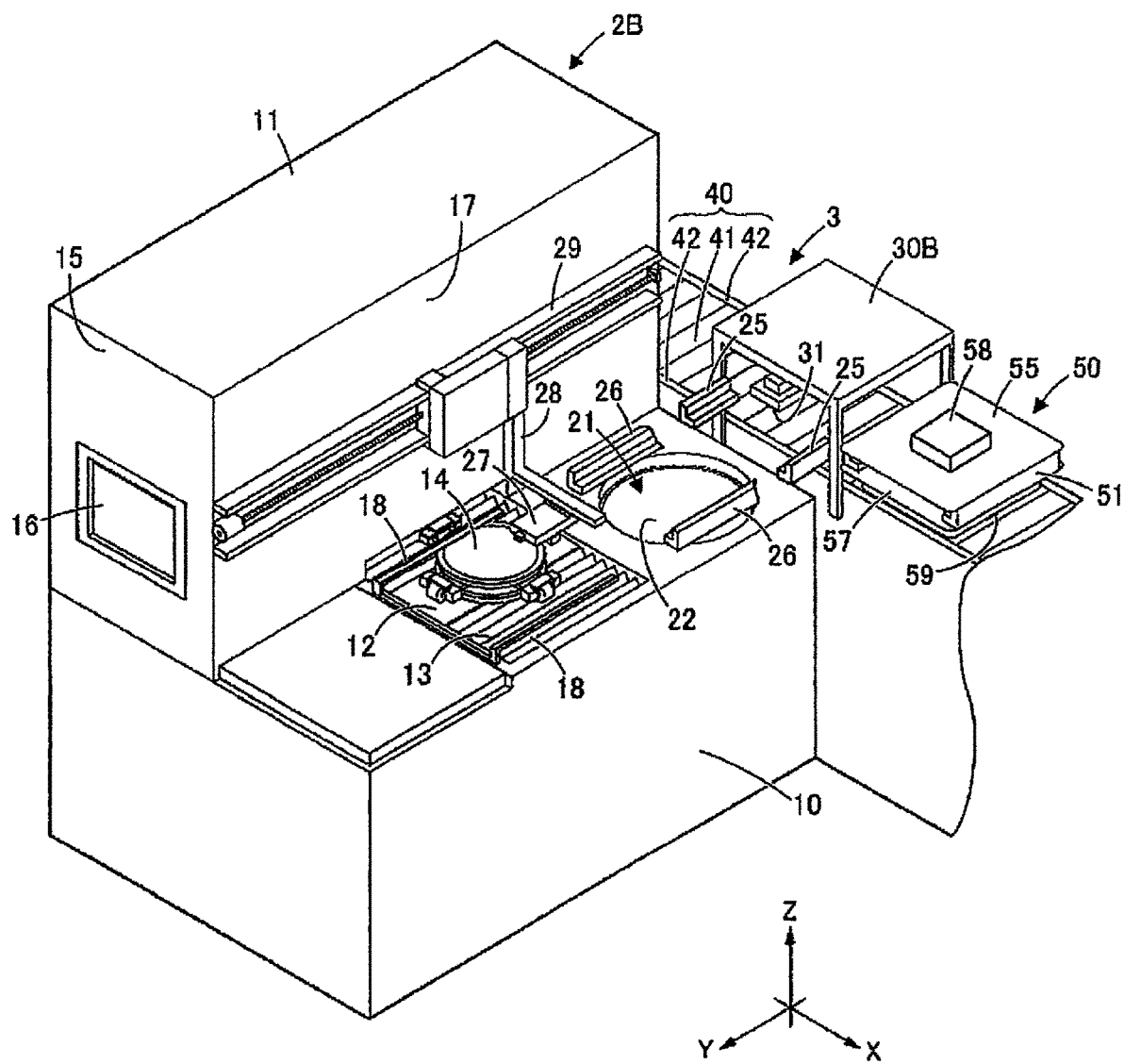
FIG. 2 is a perspective view of a wafer treating apparatus and a conveying mechanism according to the embodiment that are incorporated in the wafer processing system illustrated in FIG. 1.
Figure 3A:
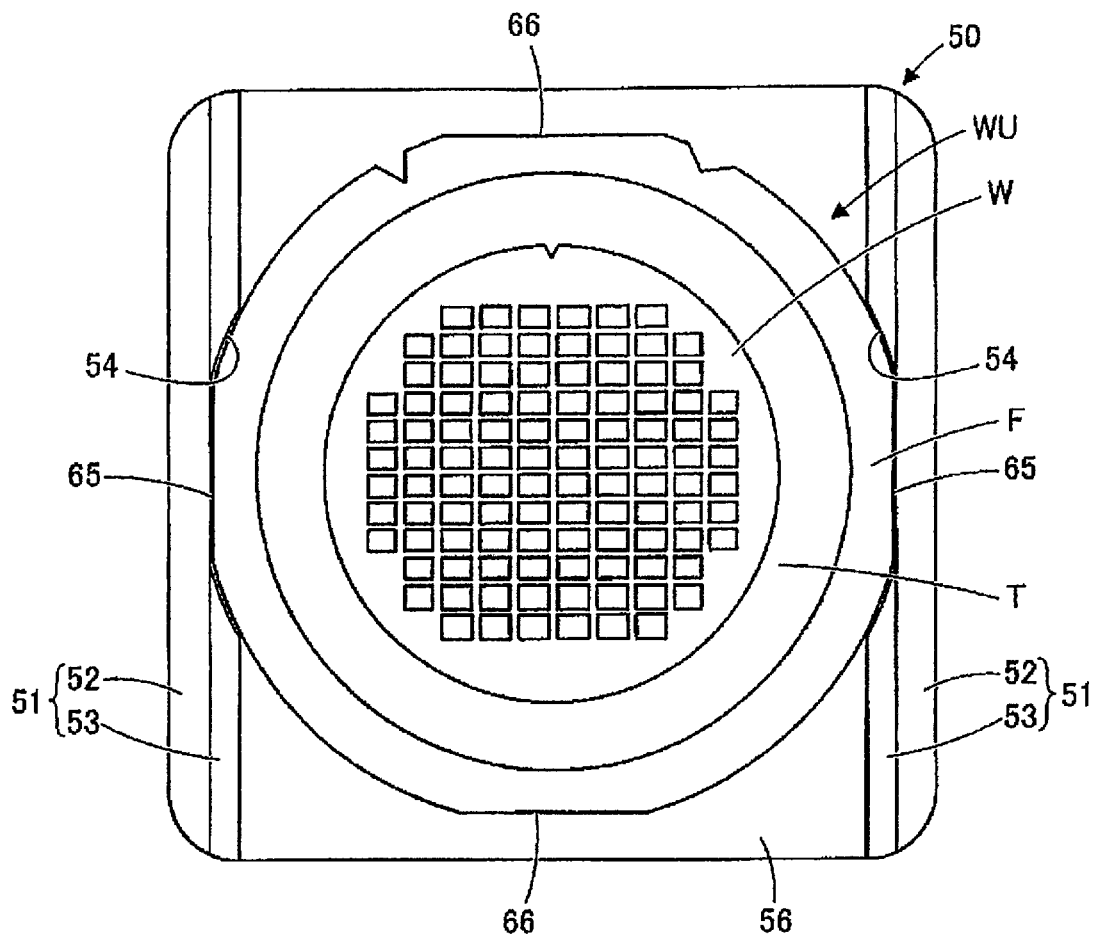
FIG. 3A is a plan view of a housing tray according to the embodiment.
Figure 3B:
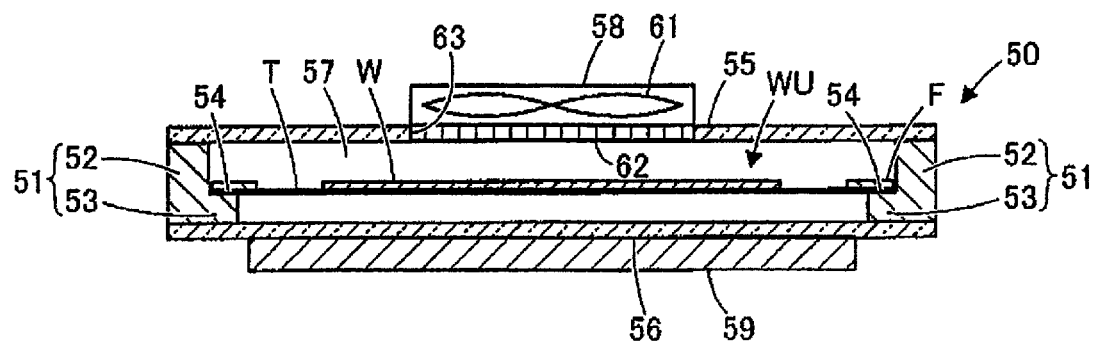
FIG. 3B is a side elevational view of the housing tray according to the embodiment.
Figure 4:
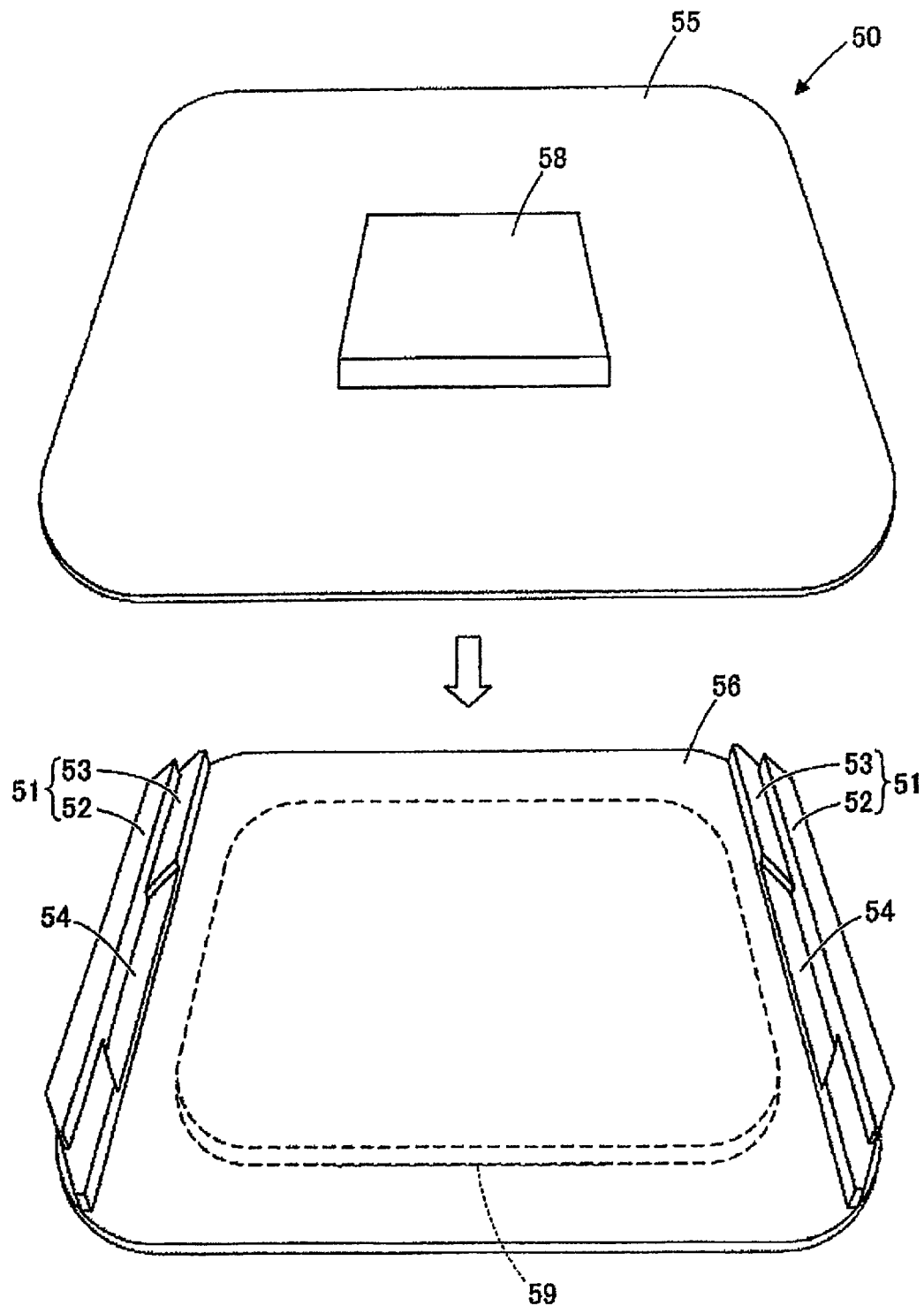
FIG. 4 is a perspective view of the housing tray according to the embodiment.

The wafer treating apparatus 2 and the conveying mechanism 3 will be described in detail below with reference to FIGS. 2 through 4. FIG. 2 is a perspective view of the processing apparatus 2B and the conveying mechanism 3 according to the embodiment that are incorporated in the wafer processing system 1 illustrated in FIG. 1. FIG. 3A is a plan view of the housing tray 50 according to the embodiment. FIG. 3B is a side elevational view of the housing tray 50 according to the embodiment. FIG. 4 is a perspective view of the housing tray 50 according to the embodiment. In FIG. 2, a cutting apparatus is illustrated as the processing apparatus 2B. In FIG. 3A, the ceiling plate 55 is omitted from illustration. In FIG. 4, the ceiling plate 55 is illustrated as detached from side walls of the housing tray 50.

As illustrated in FIG. 2, the processing apparatus 2B is arranged to take a wafer unit WU (see FIGS. 3A and 3B) from a housing tray 50 on the conveying mechanism 3 and have a cutting mechanism, not depicted, cut the wafer unit WU. The processing apparatus 2B includes a casing 11 on a substantially half portion of a base 10. The cutting mechanism is housed in the casing 11, and various mechanisms for loading and unloading wafer units WU and a cleaning mechanism 21 for cleaning wafer units WU are disposed on the base 10 outside of the casing 11. The processing apparatus 2B has a conveying space outside of the casing 11 extending perpendicularly to the conveying path of the conveyor 41. The transfer mechanism 30B is disposed over the conveying path of the conveyor 41 in alignment with the conveying space of the processing apparatus 2B. The wafer unit WU housed in the housing tray 50 on the conveying mechanism 3 is introduced into the processing apparatus 2B by the transfer mechanism 30B.

The base 10 has an upper panel lying outside of the casing 11. The upper panel of the base 10 has a central opening defined therein that extends into the casing 11. The opening is covered with a movable plate 12 that is movable with a chuck table 14 disposed thereon and a water-resistant cover 13 in the form of a bellows. The water-resistant cover 13 lies over a ball-screw actuating mechanism, not depicted, for moving the chuck table 14 in an X-axis direction indicated by an arrow X. In FIG. 2, the chuck table 14 is illustrated as being moved out of the casing 11 by the actuating mechanism. A pair of centering guides 18 extending in a Y-axis direction indicated by an arrow Y are disposed above the chuck table 14. The centering guides 18 are moveable toward and away from each other along the X-axis direction to position the wafer unit WU in the X-axis direction.

The cleaning mechanism 21 that cleans the wafer unit WU is disposed between the chuck table 14 and the transport unit 40 in the conveying space outside of the casing 11. The cleaning mechanism 21 includes a spinner table 22 for supporting and spinning the wafer unit WU about its own axis. While the wafer unit WU on the spinner table 22 is being spun, cleaning water is applied to the wafer unit WU to clean the wafer unit WU and then drying air is applied to the wafer unit WU to dry the wafer unit WU. A pair of securing guides 25 are disposed above the cleaning mechanism 21 adjacent to the transfer mechanism 30B. The securing guides 25 serve as a loading and unloading port of the processing apparatus 2B. The wafer unit WU is loaded into and unloaded out of the processing apparatus 2B through the securing guides 25 while being positioned by the securing guides 25.

A pair of lifting and lowering guides 26 are disposed over the cleaning mechanism 21 adjacent to the securing guides 25. The lifting and lowering guides 26 are vertically movable between a lifted position horizontally aligned with the securing guides 25 and a lowered position in the base 10 by a lifting and lowering mechanism, not depicted. When the lifting and lowering guides 26 are in the lifted position, the securing guides 25, the lifting and lowering guides 26, and the centering guides 18 jointly define a conveying passageway for guiding the wafer unit WU from the transfer mechanism 30 to a position above the chuck table 14. When the lifting and lowering guides 26 are in the lowered position, the wafer unit WU from the transfer mechanism 30B is placed on the spinner table 22.

A conveying arm 28 with a push-pull mechanism 27 disposed on a distal end portion thereof is mounted on a side surface 17 of the casing 11 by a ball-screw actuating mechanism 29. The push-pull mechanism 27 grips the wafer unit WU. The ball-screw actuating mechanism 29 conveys the wafer unit WU gripped by the push-pull mechanism 27 in the Y-axis direction. The conveying arm 28 is vertically movable on the ball-screw actuating mechanism 29 for transferring the wafer unit WU between the centering guides 18 and the chuck table 14 and also between the lifting and lowering guides 26 and the spinner table 22. A touch-panel monitor 16 for operating the processing apparatus 2B is mounted on a front surface 15 of the casing 11.

The processing apparatus 2B thus constructed operates as follows: The wafer unit WU is taken out from the housing tray 50 and conveyed to the centering guides 18. After the wafer unit WU is positioned by the centering guides 18, the wafer unit WU is placed onto the chuck table 14. The wafer unit WU is then processed by the cutting mechanism in the casing 11. Thereafter, the wafer unit WU is conveyed to the lifting and lowering guides 26, and delivered to the cleaning mechanism 21 by the lifting and lowering guides 26. After the wafer unit WU is cleaned by the cleaning mechanism 21, the wafer unit WU is delivered from the lifting and lowering guides 26 and inserted into the housing tray 50.

The conveying mechanism 3 is arranged to convey the housing tray 50 that houses the wafer unit WU therein between the wafer treating apparatus 2 while the housing tray 50 is supported on the transport unit 40. The housing tray 50 is in the shape of a box-like receptacle of low profile with opposite sides open, and houses the wafer unit WU positioned therein. The transport unit 40 includes the conveyor 41 that conveys the housing trays 50 and a pair of transport guides 42 disposed respectively on both sides of the conveyor 41 for guiding the housing trays 50 to travel along the conveyor 41. The conveyor 41 and the transport guides 42 define the conveying path. Each housing tray 50 includes a seat 59 on the bottom plate 56 thereof. The guide width between the transport guides 42 is adjusted to match the size of the seat 59.

The transfer mechanism 30B for transferring the wafer unit WU between the housing tray 50 and the processing apparatus 2B is disposed over the transport unit 40. The transfer mechanism 30B includes a push-pull mechanism 31 for taking the wafer unit WU into and out of the housing tray 50. The push-pull mechanism 31 grips the wafer unit WU. The wafer unit WU gripped by the push-pull mechanism 31 is conveyed in the Y-axis direction by a ball-screw actuating mechanism, not depicted, mounted on a top panel of the transfer mechanism 30B. The push-pull mechanism 31 takes the wafer unit WU to be processed out of the housing tray 50, and brings the processed wafer unit WU back into the housing tray 50.

Housing trays 50 with wafer units WU housed respectively therein are successively delivered to the processing apparatus 2B by the conveyor 41. In other words, one at a time of the wafer units WU housed in the housing trays 50 is conveyed to the processing apparatus 2B by the conveyor 41. When the processing of a wafer unit WU by the processing apparatus 2B is completed, the processed wafer unit WU is conveyed without pause to the unloading apparatus 2D in the subsequent stage (see FIG. 1) by the conveying mechanism 3. Since the processing apparatus 2B is successively supplied with wafer units WU, any standby time spent by the processing apparatus 2B is not increased because a plurality of wafer units WU carried by a cassette are not conveyed all together to the processing apparatus 2B.

As illustrated in FIGS. 3A, 3B, and 4, the wafer unit WU that is housed in the housing tray 50 includes an annular frame F whose outer circumferential edge has two flat faces 65 diametrically opposite each other and extending parallel to each other and two flat faces 66 diametrically opposite each other and extending parallel to each other perpendicularly to the flat faces 65. The wafer unit WU further includes the wafer W disposed inside of and supported on the annular frame F by a holding tape T. The housing tray 50 includes a pair of side walls 51 whose upper ends are interconnected by the ceiling plate 55 and whose lower ends are interconnected by a bottom plate 56. The openings 57 are defined in the respective sides between the side walls 51. As described above, the housing tray 50 is in the shape of a box-like receptacle of low profile with the openings 57 defined respectively in the sides. A wafer unit WU can be taken into and out of the housing tray 50 through one of the openings 57.

Each of the side walls 51 is in the form of a rail having an L-shaped cross section that includes a vertical plate 52 for guiding a side edge of the annular frame F of a wafer unit WU and a horizontal plate 53 for guiding a bottom end surface of the annular frame F. The side walls 51 are spaced from each other and face each other with the openings 57 defined in the sides between the longitudinal ends of the side walls 51. The wafer unit WU can be taken into and out of the housing tray 50 through one of the openings 57 while being supported by the side walls 51. When the wafer unit WU is inserted through the opening 57 into the housing tray 50, the opposite edge portions of the wafer unit WU are supported by the respective side walls 51, so that the wafer unit WU is stably held in the housing tray 50.

The vertical plates 52 have inner surfaces facing each other and spaced from each other by a distance that is corresponding to the distance between the flat faces 65 of the annular frame F of the wafer unit WU housed in the housing tray 50. When the wafer unit WU is taken into and out of the housing tray 50, the wafer unit WU is guided in an orientation determined by the facing inner surfaces of the vertical plates 52 and the flat faces 65 of the annular frame F. The horizontal plates 53 have engaging recesses 54 defined in upper surfaces thereof for engaging arcuate outer edge portions of the annular frame F. The engaging recesses 54 are defined stepwise in the upper surfaces of the horizontal plate 53 for engaging side portions of the annular frame F that include the flat faces 65. When the side portions of the annular frame F are placed snugly in the respective engaging recesses 54, the wafer unit WU is positioned in all directions in the housing tray 50.

The ceiling plate 55 supports an air flow generator 58 disposed on a central upper surface thereof for drawing in air from above the housing tray 50 and generating air downflows from the ceiling plate 55 to the openings 57. The air flow generator 58 includes a fan mechanism 61 with a high efficiency particulate air (HEPA) filter 62. The HEPA filter 62 is mounted in an attachment hole 63 defined in the ceiling plate 55. The fan mechanism 61 is disposed on an upper surface of the HEPA filter 62. When the fan mechanism 61 is actuated, it introduces a gas, typically, ambient air into the housing tray 50 through the HEPA filter 62. The HEPA filter 62 traps contaminants included in the air, and delivers clean air into the housing tray 50.

Since clean air is delivered from the HEPA filter 62 into the housing tray 50 and discharged out of the housing tray 50 through the openings 57, no contaminants are introduced into the housing tray 50 and are deposited on the wafer unit WU in the housing tray 50. Even if contaminants are deposited on the wafer unit WU, they are forced to flow out of the housing tray 50 through the openings 57 by the flows of clean air. Since clean air is delivered into the housing tray 50 by the air flow generator 58, it is possible to convey the wafer unit WU carried in the housing tray 50 while the space in the housing tray 50 is kept clean by the clean air.

In the illustrated embodiment, the HEPA filter 62 is incorporated in the air flow generator 58. However, any other air filter capable of trapping contaminants may be incorporated in the air flow generator 58. For example, an ultra low penetration air (ULPA) filter that can trap contaminants with a higher particulate collection efficiency than the HEPA filter 62 may be incorporated in the air flow generator 58. The fan mechanism 61 is energized by a battery, not depicted, as a power supply thereof. However, the fan mechanism 61 may be powered by a solar cell that can generate electricity with indoor illumination. Alternatively, the fan mechanism 61 may be supplied with electric power through a feeder cable placed along the conveying path of the conveying mechanism 3.

The ceiling plate 55 is made of a transparent material so that the wafer unit WU housed in the housing tray 50 is visible from outside. The annular frame F of the wafer unit WU is marked with a wafer code that can be read from outside while the wafer unit WU is housed in the housing tray 50. The wafer code contains information regarding the wafer W, such as a wafer identification (ID) or the like. The wafer treating apparatus 2 has handling conditions set according to the wafer code. The readability of the wafer code is not impaired by contaminants as the deposition of contaminants on the ceiling plate 55 and the wafer code is minimized by air downflows in the housing tray 50.

The seat 59 on the bottom plate 56 of the housing tray 50 is of an outer profile narrower than the outer profile of the bottom plate 56. The width of the seat 59 is the same as the width of the conveyor 41, i.e., the guide width between the transport guides 42 (see FIG. 2). The seat 59 is commonly used with housing trays 50 having different sizes. Therefore, the single conveyor 41 can convey housing trays 50 having different sizes, and hence the guide width of the conveyor 41 can be reduced to allow the conveying mechanism 3 to have a reduced footprint. Furthermore, the seat 59 is of a rectangular shape with round corners, as viewed in plan, so that the seat 59 will not be caught by corners of the circulatory conveying path.

Figure 5A:
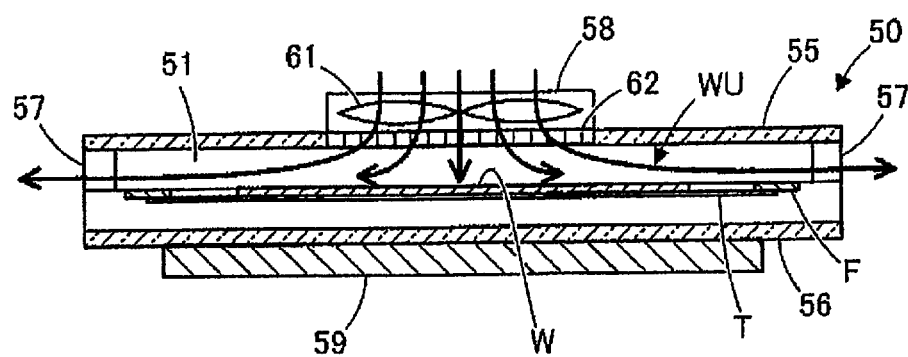
FIGS. 5A and 5B are views illustrating air downflows in the housing tray according to the embodiment.
Figure 5B:
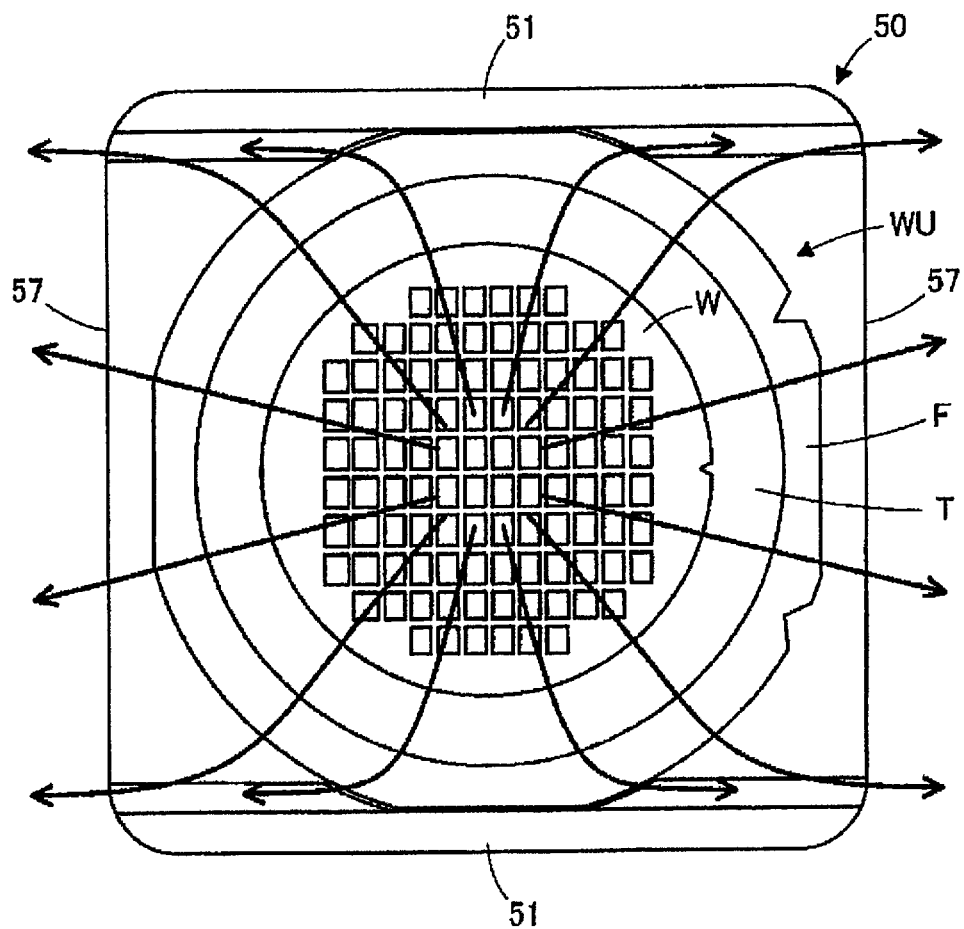

The air downflows in the housing tray 50 will be described below with reference to FIGS. 5A and 5B. FIGS. 5A and 5B are views illustrating air downflows in the housing tray 50 according to the embodiment.

As illustrated in FIGS. 5A and 5B, the wafer unit WU is housed in the housing tray 50. When the fan mechanism 61 of the air flow generator 58 is actuated, the fan mechanism 61 introduces ambient air through the HEPA filter 62 from the ceiling plate 55 into the housing tray 50. As the ambient air passes through the HEPA filter 62, contaminants contained in the ambient air are trapped by the HEPA filter 62 and clean air is applied to a central area of the wafer W. When the air is applied to the central area of the wafer W, air flows are produced from the central area of the wafer W radially outwardly toward the outer edge of the wafer W. As the entire surface area of the wafer W is exposed to the air flows, contaminants are prevented from being deposited on the wafer W.

When the air is spread radially over the surface of the wafer W, air flows directed toward the openings 57 flow straight into the openings 57 whereas air flows directed toward the side walls 51 impinge upon the side walls 51 and are redirected toward the openings 57. The air is thus introduced through the HEPA filter 62 from the ceiling plate 55 into the housing tray 50 as clean air downflows spreading over the wafer W and flowing into the openings 57. Since the air is discharged from the openings 57, no contaminants are introduced from the openings 57 into the housing tray 50, which is kept clean at all times.

The housing tray 50 is not only internally kept clean by the air downflows generated therein, but also functions as an air cleaner that traps, with the HEPA filter 62, contaminants in the clean room where the housing trays 50 are conveyed by the conveying mechanism 3. Specifically, while the housing trays 50 are conveyed by the transport unit 40 of the conveying mechanism 3, the HEPA filters 62 of the housing trays 50 trap contaminants in the air in the clean room.

Therefore, the HEPA filters 62 of the housing trays 50 purify air not only in the housing trays 50, but also in the clean room. Since the housing trays 50 are successively conveyed by the transport unit 40, an area around the conveying path is always kept clean as the air in and around the housing trays 50 that are conveyed is purified by the HEPA filters 62.

With the conveying mechanism 3 according to the present embodiment, as described above, when the wafer unit WU is inserted into each housing tray 50 through one of the openings 57, the wafer unit WU is held in the housing tray 50 by the side walls 51. In the housing tray 50, air downflows directed from the ceiling plate 55 into the openings 57 are generated by the air flow generator 58, preventing contaminants from being introduced into the housing tray 50 through the openings 57. While the wafer unit WU is conveyed, no contaminants are deposited on the wafer W. Consequently, clean wafers W are transferred to the wafer treating apparatus 2. Furthermore, inasmuch as the transport unit 40 conveys wafers W, one by one, between the wafer treating apparatus 2, any standby time spent by subsequent wafer treating apparatus 2 is minimized, resulting in a reduced wasteful standby time.

In the present embodiment, the transport unit 40 that has the conveyor 41 is illustrated by way of example. However, the present invention is not limited to such a conveyor unit. The present invention is applicable to a transfer unit that is capable of conveying wafer units housed in housing trays, one by one, between wafer treating apparatus, e.g., a ground-traveling carriage such as an automatic guided vehicle (AGV), a rail guided vehicle (RGV), or the like, or a ceiling-traveling carriage such as an overhead hoist transfer (OHT) vehicle, an overhead shuttle (OHS), or the like.

In the present embodiment, the transfer unit conveys housing trays along the circulatory path. However, the present invention is not limited to such a transfer unit. The present invention is applicable to a transfer unit that does not convey housing trays along a circulatory path.

In the present embodiment, the annular frame illustrated as having four flat faces on its outer circumferential edge. However, the present invention is not limited to such an annular frame. The present invention is applicable to an annular frame free of flat faces on its outer circumferential edge.

In the present embodiment, the housing tray has the seat on the bottom plate. However, the present invention is not limited to such a housing tray. The present invention is applicable to a housing tray including a pair of side walls whose upper ends are interconnected by a ceiling plate and whose lower ends are interconnected by a bottom plate, with openings defined in sides between the longitudinal ends of the side walls, the bottom plate being free of a seat.

In the present embodiment, the air flow generator includes the fan mechanism with the air filter. However, the present invention is not limited to such an air flow generator. The present invention is applicable to an air flow generator that is arranged to generate air downflows directed from the ceiling plate of the housing tray into the openings.

In the present embodiment, the wafer treating apparatus include the loading apparatus, the processing apparatus, and the unloading apparatus, the loading apparatus including the mounter, the processing apparatus including the cutting apparatus, and the unloading apparatus including the cassette apparatus. However, the present invention is not limited to such wafer treating apparatus. The present invention is applicable to wafer treating apparatus that treat wafers in various different ways. For example, the wafer treating apparatus to which the present invention is applicable may include grinding apparatus, polishing apparatus, laser processing apparatus, plasma etching apparatus, edge trimming apparatus, expanding apparatus, breaking apparatus, and a cluster system having a combination of processing apparatus.

The conveying mechanism according to the present invention may convey various different wafers including semiconductor substrates, inorganic substrates, packaged substrates, and various other wafer-like workpieces. The semiconductor substrates may include various substrates of silicon, gallium arsenide, gallium nitride, silicon carbide, and so on. The inorganic substrates may include various substrates of sapphire, ceramics, glass, and so on. The semiconductor substrates and the inorganic substrates may have devices formed thereon or may be free of devices. The packaged substrates may include various substrates including substrates for chip size package (CSP), wafer level chip size package (WLCSP), system in package (SIP), and fan out wafer level package (FOWLP). The packaged substrates may have shields against electromagnetic interference (EMI). Workpieces to be conveyed may be made of lithium tantalate, lithium niobate, raw ceramics, and piezoelectric material before or after devices are formed thereon.

While the preferred embodiment of the present invention and the modifications thereof have been illustrated above, the embodiment and the modifications may be combined wholly or partly according to other embodiments.

The present invention is not limited to the embodiment and modifications described above, but many changes, replacements, and modifications may be made without departing from the scope of the present invention. Furthermore, the present invention may be reduced to practice according to other techniques, steps, schemes, plans, or arrangements insofar as they are capable of implementing the principles of the present invention owing to technological advances or derivations. Therefore, the scope of the appended claim should be interpreted as covering all the embodiments falling within the range of the technical idea of the present invention.

In the present embodiment, the conveying mechanism for conveying wafers has been illustrated. However, the present invention is also applicable to the conveyance of other objects.

As described above, the present invention is advantageous in that it can reduce the wasteful standby time of wafer treating apparatus and prevent contaminants from being deposited on wafers, and is effective when used as a conveying mechanism for conveying wafer units between a plurality of wafer treating apparatus.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A conveying mechanism for conveying a wafer unit having a wafer disposed inside of and supported on an annular frame by a holding tape, comprising:
   a housing tray housing the wafer unit therein; and
   a transport unit supporting and transporting the housing tray between wafer treating apparatus,
   wherein the housing tray includes a ceiling plate, a bottom plate, a pair of side walls facing each other across at least one opening through which the wafer unit can be taken into and out of the housing tray, for supporting the annular frame inserted into the housing tray through the at least one opening and holding the inserted wafer unit in the housing tray, wherein the side walls are configured and arranged to connect the ceiling plate to the bottom plate while the at least one opening is defined therebetween, and an air flow generator disposed on the ceiling plate, for introducing a gas from an upper end of the housing tray to produce downflows in the housing tray that are directed from the ceiling plate into the at least one opening, and the transport unit conveys wafers, one by one, between the wafer treating apparatus.

2. The conveying mechanism according to claim 1, wherein the air flow generator includes a fan mechanism.

3. The conveying mechanism according to claim 2, wherein the air flow generator includes a filter mechanism.

4. The conveying mechanism according to claim 3, wherein the filter mechanism includes a high efficiency particulate air filter or an ultra low penetration air filter.

5. The conveying mechanism according to claim 1, wherein the air flow generator includes a fan mechanism and a filter mechanism for trapping contaminants included in the air and delivering clean air into the housing tray.

6. The conveying mechanism according to claim 5, wherein the fan mechanism and filter mechanism function as an air cleaner that trap contaminants in a clean room where the housing trays are conveyed by the conveying mechanism.

7. The conveying mechanism according to claim 1, wherein the at least one opening consists of two openings disposed opposite each other.

8. The conveying mechanism according to claim 1, wherein the transport unit includes:
   a conveyor that conveys the housing trays; and
   a pair of transport guides disposed respectively on both sides of the conveyor for guiding the housing tray to travel along the conveyor.

9. The conveying mechanism according to claim 8, wherein the housing tray includes a seat disposed on the bottom plate;
   wherein the seat has a width corresponding to a distance between the pair of transport guides disposed respectively on both sides of the conveyor.

* * * * *